(12) United States Patent
Hsieh

(10) Patent No.: US 10,714,454 B2
(45) Date of Patent: Jul. 14, 2020

(54) STACK PACKAGING STRUCTURE FOR AN IMAGE SENSOR

(71) Applicant: SEMICONDUCTOR COMPONENTS INDUSTRIES, LLC, Phoenix, AZ (US)

(72) Inventor: Yu-Te Hsieh, Taoyuan (TW)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 16/103,135

(22) Filed: Aug. 14, 2018

(65) Prior Publication Data
US 2020/0058618 A1    Feb. 20, 2020

(51) Int. Cl.
| | |
|---|---|
| *H01L 25/065* | (2006.01) |
| *H01L 23/28* | (2006.01) |
| *H01L 27/146* | (2006.01) |
| *H01L 23/00* | (2006.01) |
| *H01L 23/488* | (2006.01) |

(52) U.S. Cl.
CPC .......... *H01L 25/0657* (2013.01); *H01L 23/28* (2013.01); *H01L 23/488* (2013.01); *H01L 24/01* (2013.01); *H01L 27/14678* (2013.01)

(58) Field of Classification Search
CPC ... H01L 25/0657; H01L 23/28; H01L 23/488; H01L 24/01; H01L 27/14678
See application file for complete search history.

(56) References Cited

U.S. PATENT DOCUMENTS

| | | | |
|---|---|---|---|
| 2006/0051892 A1 | 3/2006 | Bolken et al. | |
| 2010/0200898 A1* | 8/2010 | Lin | H01L 27/14618 257/294 |
| 2010/0310137 A1 | 12/2010 | Chou et al. | |
| 2012/0248439 A1* | 10/2012 | Lee | H01L 23/49838 257/48 |
| 2013/0221470 A1 | 8/2013 | Kinsman et al. | |
| 2014/0120662 A1* | 5/2014 | Onodera | H01L 21/563 438/108 |
| 2015/0091167 A1* | 4/2015 | Geissler | B81C 1/00261 257/738 |
| 2015/0140736 A1* | 5/2015 | Pendse | H01L 24/19 438/109 |
| 2017/0256576 A1* | 9/2017 | Hsieh | H01L 27/14618 |
| 2018/0053745 A1* | 2/2018 | Cheng | H01L 25/0657 |
| 2018/0138225 A1* | 5/2018 | Kim | H01L 21/565 |
| 2018/0144175 A1* | 5/2018 | Tzu | G06K 9/0004 |

* cited by examiner

*Primary Examiner* — Fernando L Toledo
*Assistant Examiner* — Neil R Prasad
(74) *Attorney, Agent, or Firm* — Brake Hughes Bellermann LLP

(57) ABSTRACT

According to an aspect, a stack packaging structure includes a substrate, a semiconductor device coupled to a surface of the substrate, an image sensor device coupled to the semiconductor device such that the semiconductor device is disposed between the surface of the substrate and the image sensor device, at least one bond wire connected to the image sensor device and the surface of the substrate, a inner molding disposed between the surface of the substrate and the image sensor device, where the semiconductor device is encapsulated within the inner molding, and an outer molding disposed on the surface of the substrate, where the at least one bond wire is encapsulated within the outer molding.

20 Claims, 9 Drawing Sheets

STACK PACKAGING STRUCTURE FOR AN IMAGE SENSOR

TECHNICAL FIELD

This description relates to a stack packaging structure for an image sensor.

BACKGROUND

Integrated circuits (ICs) may require packaging to enclose chips and provide protection during shipping, assembly and subsequent use. In some packaging structures, IC devices are assembled on the backend of the printed circuit board (PCB) with relatively long traces interconnected with the image sensor.

SUMMARY

According to an aspect, a stack packaging structure includes a substrate, a semiconductor device coupled to a surface of the substrate, an image sensor device coupled to the semiconductor device such that the semiconductor device is disposed between the surface of the substrate and the image sensor device, at least one bond wire connected to the image sensor device and the surface of the substrate, a inner molding disposed between the surface of the substrate and the image sensor device, where the semiconductor device is encapsulated within the inner molding, and an outer molding disposed on the surface of the substrate, where the at least one bond wire is encapsulated within the outer molding.

According to some aspects, the stack packaging structure may include one or more of the following features (or any combination thereof). The outer molding may include a material that is different than a material of the inner molding. The outer molding may include a material that is the same as a material of the inner molding. The semiconductor device may be coupled to the surface of the substrate using bump members, where the bump members is at least partially disposed within an under-fill material, and the inner molding has a material that is the same as the under-fill material. The inner molding may include an epoxy material. The stack packaging structure may include an adhesive layer disposed between the image sensor device and the semiconductor device. The semiconductor device may be a first semiconductor device, and the stack packaging structure further includes a second semiconductor device coupled to the surface of the substrate, where the second semiconductor device is encapsulated within the inner molding. The stack packaging structure may include a third semiconductor device coupled to the surface of the substrate, where the third semiconductor device is encapsulated within the inner molding. The stack packaging structure may include a transparent member coupled to the image sensor device such that an empty space exists between an active region of the image sensor device and the transparent member. The outer molding may extend along an edge of the inner molding, an edge of the image sensor device, and an edge of the transparent member. The semiconductor device may include an image signal processor (ISP) integrated circuit (IC) die. The surface of the substrate may be a first surface, and the substrate includes a second surface opposite to the first surface. The stack packaging structure may include a plurality of conductive components coupled to the second surface of the substrate, where the plurality of conductive components is configured to connect to an external device.

According to an aspect, a stack packaging structure includes a substrate, a first semiconductor device coupled to a surface of the substrate, a second semiconductor device coupled to the surface of the substrate, an image sensor device disposed on the first semiconductor device and the second semiconductor device, an inner molding disposed between the surface of the substrate and the image sensor device, where the first semiconductor device and the second semiconductor device are encapsulated within the inner molding, and an outer molding disposed on the surface of the substrate, where the outer molding extends along an edge of the inner molding and an edge of the image sensor device.

According to some aspects, the stack packaging structure may include one or more of the above and/or below features (or any combination thereof). The first semiconductor device may be coupled to the surface of the substrate using bump members, where the bump members are at least partially disposed within an under-fill material, and the inner molding has a material that is the same as the under-fill material. The inner molding may include an epoxy material. The second semiconductor device may include a driver integrated circuit (IC) die or a memory IC die. The stack packaging structure may include at least one bond wire connected to the image sensor device and the surface of the substrate. The stack packaging structure may include a third semiconductor device coupled to the surface of the substrate, where the third semiconductor device is encapsulated within the inner molding.

According to an aspect, a method of assembling a stack packaging structure includes coupling a semiconductor device to a substrate in a flip-chip configuration, applying an inner molding to cover the semiconductor device, coupling an image sensor device to the inner molding, connecting at least one bond wire to the image sensor device and the substrate, coupling a transparent member to the image sensor device, and applying an outer molding to cover the at least one bond wire and an edge portion of the transparent member.

According to an aspect, a method of assembling a stack packaging structure includes coupling a semiconductor device to a substrate in a flip-chip configuration, coupling an image sensor device to the semiconductor device, applying an inner molding between the substrate and the image sensor device, connecting at least one bond wire to the image sensor device and the substrate, coupling a transparent member to the image sensor device, and applying an outer molding to cover the at least one bond wire and an edge portion of the transparent member.

The details of one or more implementations are set forth in the accompanying drawings and the description below. Other features will be apparent from the description and drawings, and from the claims.

DETAILED DESCRIPTION

The present disclosure relates to a stack packaging structure for an image sensor device that may reduce the size of the overall package while increasing the number devices included in this structure, reduce (or eliminate) noise on the image signal transferred from the image sensor device to the devices, and/or reduce the cost for manufacturing such packages. In some examples, the stack packaging structure may include an inner molding that encapsulates one or more devices coupled to a substrate, and an outer molding that encapsulates the inner molding, the image sensor device, and a transparent member coupled to the image sensor device. In some examples, the one or more devices is/are coupled to the substrate in a flip-chip configuration with bump members (e.g., bumps, pillars, etc.), and an under-fill material is used between the devices and the substrate. In some examples, the inner molding includes an under-fill material that is the same or similar to the under-fill material used in the flip-chip configuration. In some examples, the outer molding is an epoxy-based molding or encapsulation that protects the image sensor device. In some examples, the inner molding includes an epoxy material that is the same or similar to the outer molding. In some examples, the dual molding structure may increase the durability of the packaging structure and reduce (or prevent) moisture from interfering with the operation of the image sensor devices and other devices included within the packaging structure.

Figure 1A:
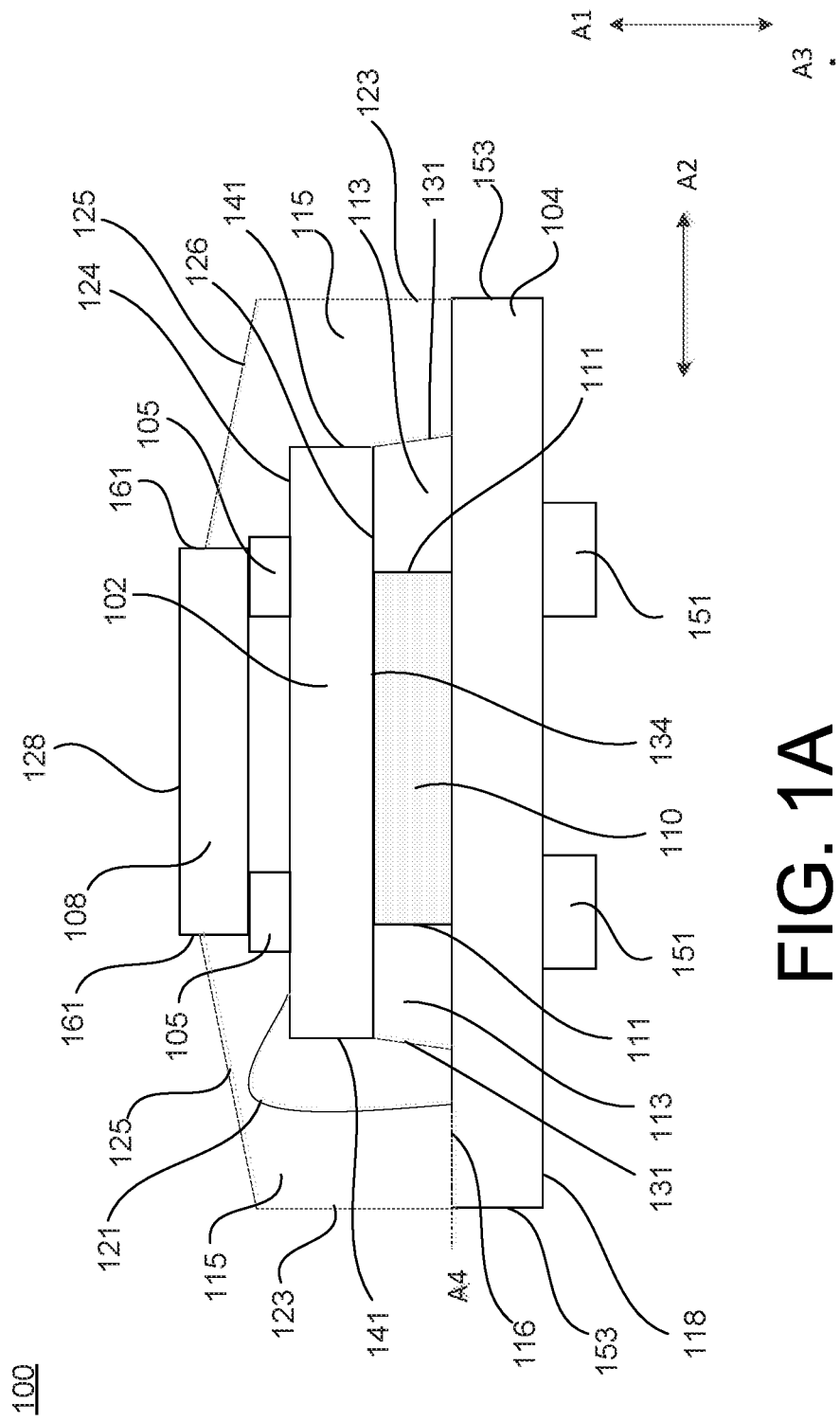
FIGS. 1A through 1C illustrate stack packaging structures for image sensor devices according to various aspects.
Figure 1B:
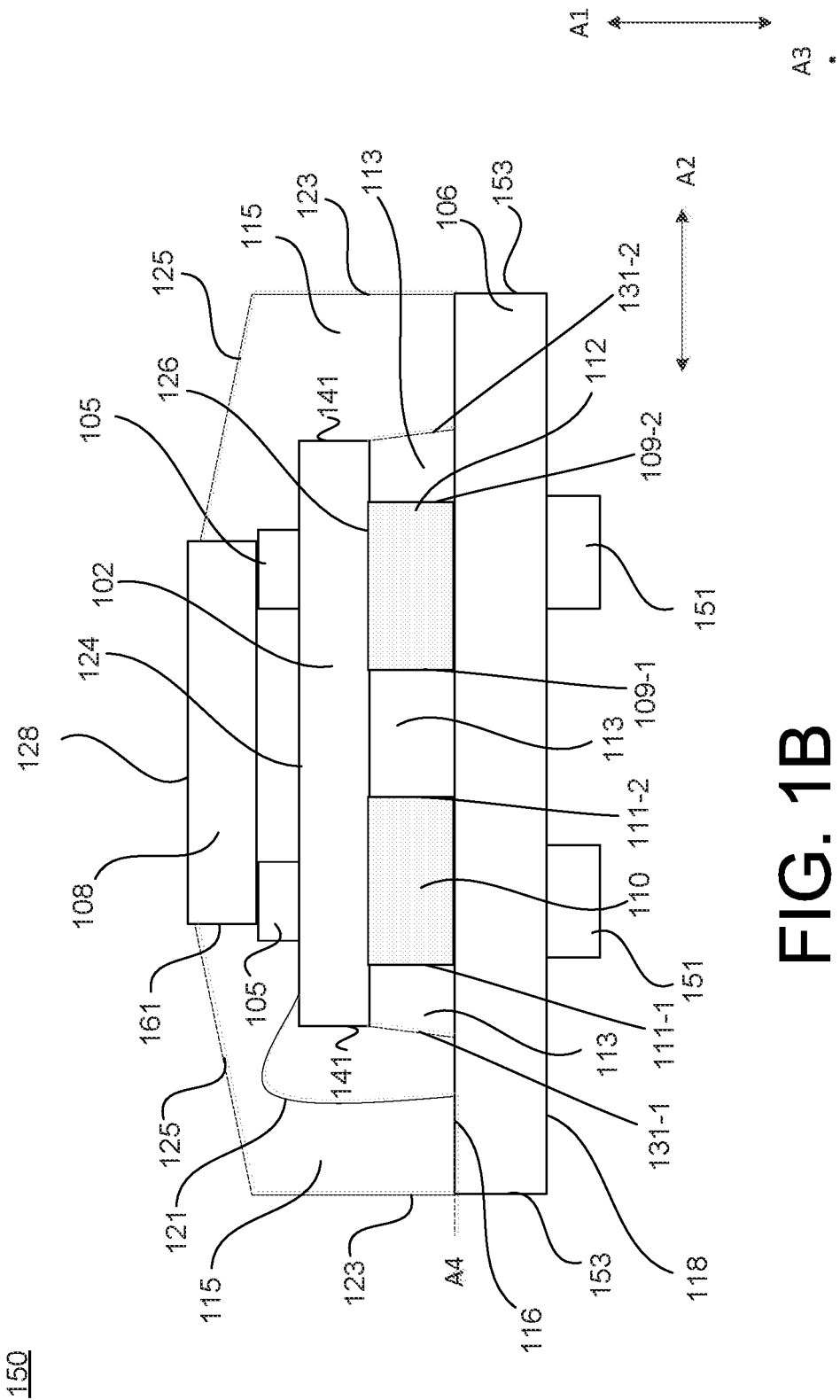
Figure 1C:
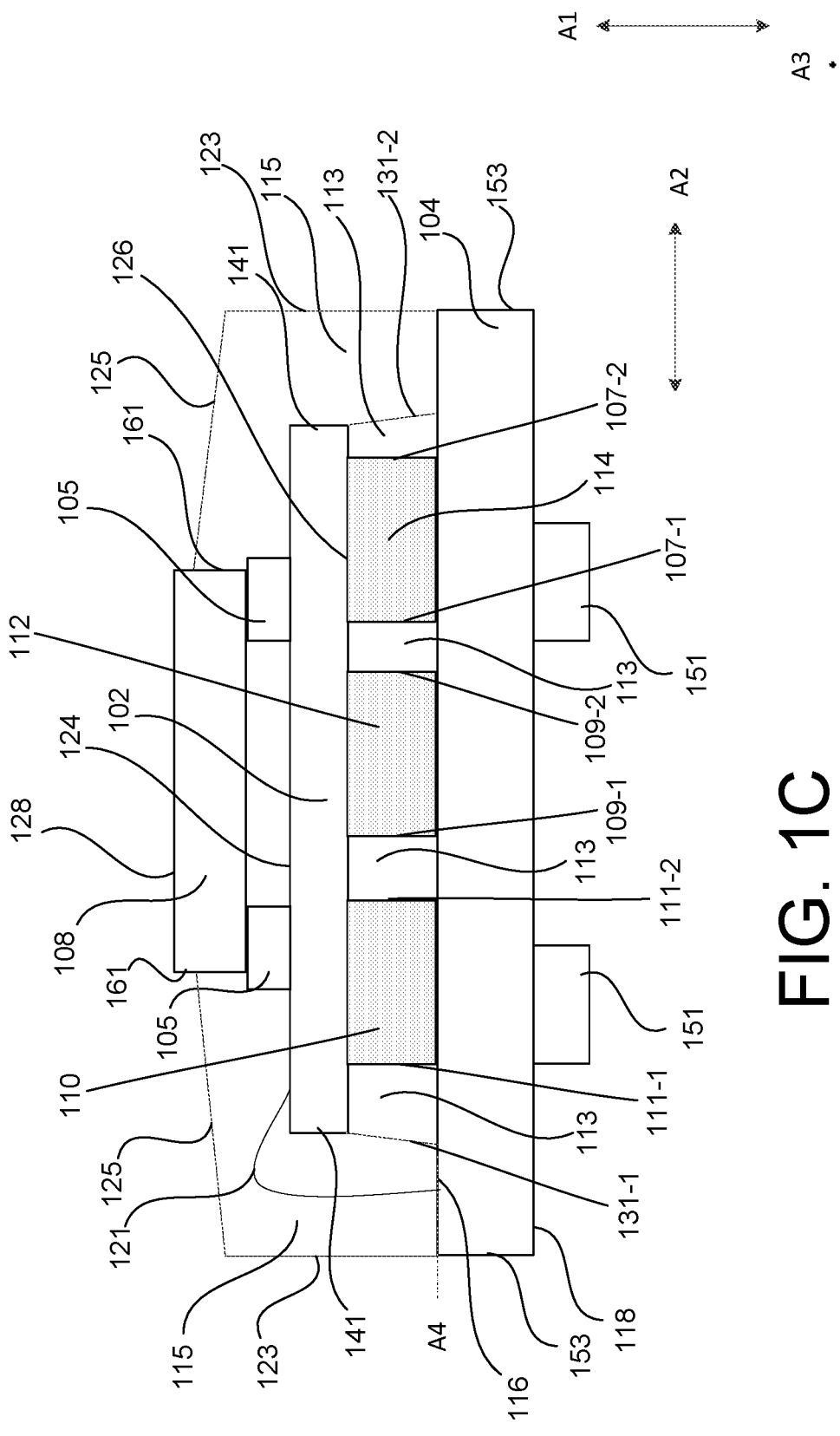

FIGS. 1A-1C illustrate stack packaging structures according to various aspects. FIG. 1A illustrates a stack packaging structure 100 for an image sensor device 102 according to an aspect. The image sensor device 102 includes an image sensor die having, or corresponds with, an array of pixel elements configured to convert electromagnetic radiation (e.g., light) to electrical signals. In some examples, the image sensor device 102 includes a complementary metal-oxide semiconductor (CMOS) image sensor. The image sensor device 102 includes a first surface 124 and a second surface 126. The stack packaging structure 100 includes a transparent member 108 coupled to the image sensor device 102 such that the transparent member 108 is positioned over (and spaced apart from) the first surface 124 of the image sensor device 102 in a direction A1. The transparent member 108 includes an optically transparent material that allows electromagnetic radiation (e.g., light (e.g., visible light)) to pass through (e.g., pass through the entirety of the material). In some examples, the transparent member 108 includes a cover. In some examples, the transparent member 108 includes a lid. In some examples, the transparent member 108 includes one or more organic materials and/or one or more inorganic materials. In some examples, the transparent member 108 includes a glass material. In some examples, the transparent member 108 includes one or more layers of transparent material.

In some examples, the stack packaging structure 100 includes dam members 105 that position the transparent member 108 away from the first surface 124 of the image sensor device 102. For example, the dam members 105 are coupled to the transparent member 108 and to the first surface 124 of the image sensor device 102, where a portion of the first surface 124 of the image sensor device 102 is disposed between adjacent dam members 105. In some examples, the dam members 105 include an adhesive material. In some examples, the dam members 105 include an epoxy resin. In some examples, the dam members 105 include a polymer-based material.

The stack packaging structure 100 includes a substrate 104. The substrate 104 includes a printed circuit board (PCB) substrate. In some examples, the substrate 104 includes a dielectric material. In some examples, the substrate 104 includes a single layer of PCB base material. In some examples, the substrate 104 includes multiple layers of PCB base material. The substrate 104 includes a first surface 116 and a second surface 118 that is disposed opposite to the first surface 116. In some examples, the substrate 104 includes one or more conductive layer portions (e.g., electrical traces) disposed on the first surface 116 of the substrate 104, and/or one or more conductive layer portions (e.g., electrical traces) disposed on the second surface 118 of the substrate 104. In some examples, the electrical traces may be configured to and/or used to transmit signals to and/or from devices (e.g., electronic devices included in a semiconductor region (e.g., epitaxial layer and/or semiconductor substrate)) connected to the electrical traces. In some examples, the electrical traces can include conductive traces (e.g., metallic traces) such as copper traces, aluminum traces, and/or so forth. The first surface 116 of the substrate 104 is disposed in a plane A4. In some examples, the second surface 118 is disposed in parallel with the first surface 116. A direction A1 is aligned perpendicular to the plane A4, and a direction A2 is perpendicular to the direction A1. A direction A3 into the page (shown as a dot) is aligned parallel to the plane A4 and is orthogonal to directions A1 and A2. The directions A1, A2, and A3, and plane A4, are used throughout several of the various views of the implementations described throughout the figures for simplicity.

The stack packaging structure 100 includes a first device 110 coupled to the first surface 116 of the substrate 104. In some examples, the first device 110 is coupled to the first surface 116 of the substrate 104 in a flip-chip configuration. In some examples, the first device 110 is coupled to the first surface 116 of the substrate 104 by surface mount technology (SMT) (e.g., interconnection by solder joint). In some examples, the first device 110 is coupled to the first surface 116 of the substrate 104 using one or more bump members (e.g., copper pillars with solder, gold plated bumps, solder bumps, and/or gold stud bumps, etc.). In some examples, an under-fill material is disposed the gap between the first device 110 and the first surface 116 of the substrate, where the under-fill material encapsulates the bump members. In some examples, the under-fill material is a liquid epoxy resin that is applied to the gap, and then a thermal curing is performed to cure the under-fill material. In some examples, the image sensor device 102 has a first dimension (e.g., length or width) that is defined by a distance between edges 141 of the image sensor device 102. In some examples, the first device 110 has a second dimension (e.g., length or width) that is defined by a distance between edges 111 of the first device 110. In some examples, the second dimension is less than the first dimension.

The first device 110 may include an integrated circuit die. In some examples, the first device 110 includes a semiconductor device. In some examples, the first device 110 includes an image signal processor (ISP) integrated circuit (IC) die. In some examples, the first device 110 includes a memory IC die. In some examples, the first device 110 includes one or more passive components (e.g., resistor, inductor, and/or capacitor (RLC) circuit). In some examples, the first device 110 includes a driver IC die. The image sensor device 102 is coupled to the first device 110. In some examples, an adhesive layer (e.g., a die attach film) is disposed between the surface 134 of the image sensor device 102 and the first device 110. In some examples, the image sensor device 102 is communicatively connected to the substrate 104 using at least one bond wire 121. The at least one bond wire 121 may be connected to the first surface 124 of the image sensor device 102 and the first surface 116 of the substrate 104. The at least one bond wire 121 may be a conductive (e.g., metal) wire such as aluminum, copper, or gold, or any combination thereof, for example.

The stack packaging structure 100 may include a plurality of conductive components 151 coupled to the second surface 118 of the substrate 104. In some examples, the conductive components 151 are surface-mount packaging elements. In some examples, the conductive components 151 include solder balls. The conductive components 151 are components used to connect to an external device (e.g., a ball grid array (BGA) device). However, the conductive components 151 may include other types of surface-mount packaging elements.

The stack packaging structure 100 includes an inner molding 113 disposed between the image sensor device 102 and the substrate 104. For example, the inner molding 113 may be disposed between the second surface 126 of the image sensor device 102 and the first surface 116 of the substrate 104. The inner molding 113 may encapsulate the first device 110. The inner molding 113 may extend along an edge 111 of the first device 110 in the direction A1 between the second surface 126 of the image sensor device 102 and the first surface 116 of the substrate 104. The inner molding 113 may extend to a molding edge 131 along a direction A2. The molding edge 131 may define a location of where the inner molding 113 ends. In some examples, the molding edge 131 may be disposed at a location between an edge 141 of the image sensor device 102 and an edge 153 of the substrate 104. In some examples, the molding edge 131 may be disposed at a location between the edge 141 of the image sensor device 102 and the edge 111 of the first device 110. In some examples, the molding edge 131 is substantially aligned with the edge 141 of the image sensor device 102. In some examples, the molding edge 131 is linear. In some examples, the molding edge 131 includes one or more bent or curved portions.

In some examples, the inner molding 113 includes an under-fill material. In some examples, the under-fill material includes an epoxy (e.g., a liquid epoxy that is subsequently cured), a liquid molding material (that is subsequently cured), and/or a granular molding compound. In some examples, the under-fill material is the same or similar to the under-fill material that is used under the first device 110. In some examples, the inner molding 113 includes a liquid epoxy resin that is applied between the image sensor device 102 and the substrate 104, and then the liquid epoxy resin cured via a thermal curing process. In some examples, the inner molding 113 includes a molding material that is the same or similar to the molding material used for the outer molding 115. In some examples, the inner molding 113 includes one or more types of material (e.g., in a molding compound if including multiple types of materials) such as a metal, a plastic, a resin, an epoxy, a phenolic hardener, a silica material, a pigment, a glass, a ceramic casing, and/or so forth.

The stack packaging structure 100 includes the outer molding 115 that encapsulates the at least one bond wire 121. The outer molding 115 may be disposed on the first surface 116 of the substrate 104. The outer molding 115 may extend along the molding edge 131 of the inner molding 113, the edge 141 of image sensor device 102, the dam members 105, and/or an edge 161 of the transparent member 108. In some examples, the outer molding 115 is disposed on a portion of the first surface 124 of the image sensor device 102. The outer molding 115 may extend from one or more of the edges (e.g., 131, 141, 161) in the direction A2. In some examples, the outer molding 115 defines a first molding edge 123 that defines an end of the outer molding 115 in the direction A2. In some examples, the first molding edge 123 is linear. In some examples, the first molding edge 123 includes one or more angled or curved portions. In some examples, at least a portion of the first molding edge 123 (or all of the first molding edge 123) is aligned with the direction A1. In some examples, the first molding edge 123 is disposed at an angle with respect to the direction A2. In some examples, at least a portion of the first molding edge 123 (or all of the first molding edge 123) is aligned with the edge 153 of the substrate 104. In some examples, the first molding edge 123 is disposed at a location between the edge 153 of the substrate and the molding edge 131 of the inner molding 113.

The outer molding 115 may define a second molding edge 125 defining an end of the outer molding 115 in the direction A1. The second molding edge 125 may extend from the first molding edge 123 to the edge 161 of the transparent member 108. In some examples, the second molding edge 125 is disposed at a non-zero angle with respect to the first molding edge 123 such that the outer molding 115 is tapered from a surface 128 of the transparent member 108. In some examples, the second molding edge 125 is disposed perpendicular to the first molding edge 123. In some examples, the second molding edge 125 is linear. In some examples, the second molding edge 125 includes one or more bent or cured portions.

The outer molding 115 includes one or more types of material (e.g., in a molding compound if including multiple types of materials) such as a metal, a plastic, a resin, an epoxy, a phenolic hardener, a silica material, a pigment, a glass, a ceramic casing, and/or so forth. In some examples, the outer molding 115 includes one or more materials different than a material of the inner molding 113. In some examples, the outer molding 115 includes one or more materials that is/are the same as the material of the inner molding 113.

FIG. 1B illustrates a stack packaging structure 150 for the image sensor device 102 according to another aspect. The stack packaging structure 150 may include any of the features discussed with reference to FIG. 1B. The stack packaging structure 150 includes two devices, e.g., the first device 110, and a second device 112. In some examples, the second device 112 includes a semiconductor device. In some examples, the second device 112 includes an IC die. In some examples, the second device 112 includes a memory IC die. In some examples, the second device 112 includes a driver IC die. In some examples, the second device 112 includes one or more passive RLC components. In some examples, the second device 112 includes an ISP IC die. In some examples, the first device 110 is an ISP IC die, and the second device 112 is a driver IC die or a memory IC die.

The first device 110 is coupled to the first surface 116 of the substrate 104, and the second device 112 is coupled to the first surface 116 of the substrate 104. In some examples, the second device 112 is coupled to the first surface 116 of the substrate 104 in a flip-chip configuration. In some examples, the second device 112 is coupled to the first surface 116 of the substrate 104 using one or more bump members (e.g., bumps, pillars, etc.). In some examples, an under-fill material is disposed between the second device 112 and the first surface 116 of the substrate, where the under-fill material encapsulates the bump members. In some examples, the second device 112 has a third dimension (e.g., length or width) that is defined by a distance between a first edge 109-1 and a second edge 109-2 of the second device 112. In some examples, the third dimension is less than the first dimension of the image sensor device 102. The image sensor device 102 is coupled to the first device 110 and the second device 112. In some examples, an adhesive layer (e.g., a die attach film) is disposed between the image sensor device 102 and the first and second devices 110, 112.

The inner molding 113 may encapsulate the first device 110 and the second device 112. For example, the inner molding 113 may be disposed between the image sensor device 102 and the substrate 104. The inner molding 113 may extend from a first edge 111-1 of the first device 110 to a first molding edge 131-1. The inner molding 113 may extend between a second edge 111-2 of the first device 110 to a first edge 109-1 of the second device 112. The inner molding 113 may extend from a second edge 109-2 to a second molding edge 131-2 of the inner molding 113. The first molding edge 131-1 and the second molding edge 131-2 may include any of the features explained with reference to the molding edge 131 of FIG. 1A.

FIG. 1C illustrates a stack packaging structure 180 for the image sensor device 102 according to another aspect. The stack packaging structure 180 may include any of the features discussed with reference to FIGS. 1A and/or 1B. The stack packaging structure 180 includes three devices, e.g., the first device 110, the second device 112, and a third device 114. In some examples, the third device 114 includes a semiconductor device. In some examples, the third device 114 includes an IC die. In some examples, the third device 114 includes a memory IC die. In some examples, the third device 114 includes a driver IC die. In some examples, the third device 114 includes an ISP IC die. In some examples, the third device 114 includes one or more passive RLC components. In some examples, the first device 110 is an ISP IC die, and the second device 112 is a driver IC die, and the third device 114 or a memory IC die.

The first device 110 is coupled to the first surface 116 of the substrate 104, the second device 112 is coupled to the first surface 116 of the substrate 104, and the third device 114 is coupled to the first surface 116 of the substrate 104. In some examples, the third device 114 is coupled to the first surface 116 of the substrate 104 in a flip-chip configuration. In some examples, the third device 114 is coupled to the first surface 116 of the substrate 104 using one or more bump members (e.g., bumps, pillars, etc.). In some examples, an under-fill material is disposed between the third device 114 and the first surface 116 of the substrate 104, where the under-fill material encapsulates the bump members. In some examples, the third device 114 has a fourth dimension (e.g., length or width) that is defined by a distance between a first edge 107-1 and a second edge 107-2 of the third device 114. In some examples, the fourth dimension is less than the first dimension of the image sensor device 102.

The image sensor device 102 is disposed on a surface of the first device 110, a surface of the second device 112, and a surface of the third device 114. In some examples, an adhesive layer (e.g., a die attach film) is disposed between the image sensor device 102 and the first through third devices 110, 112, 114.

The inner molding 113 may encapsulate the first device 110, the second device 112, and the third device 114. For example, the inner molding 113 may be disposed between the image sensor device 102 and the substrate 104. The inner molding 113 may extend from the first edge 111-1 of the first device 110 to the first molding edge 131-1. The inner molding 113 may extend between the second edge 111-2 of the first device 110 to the first edge 109-1 of the second device 112. The inner molding 113 may extend from the second edge 109-2 of the second device 112 to the first edge 107-1 of the third device 114. The inner molding 113 may extend from the second edge 107-2 to the second molding edge 131-2. The first molding edge 131-1 and the second molding edge 131-2 may include any of the features explained with reference to the molding edge 131 of FIG. 1A.

Figure 2A:
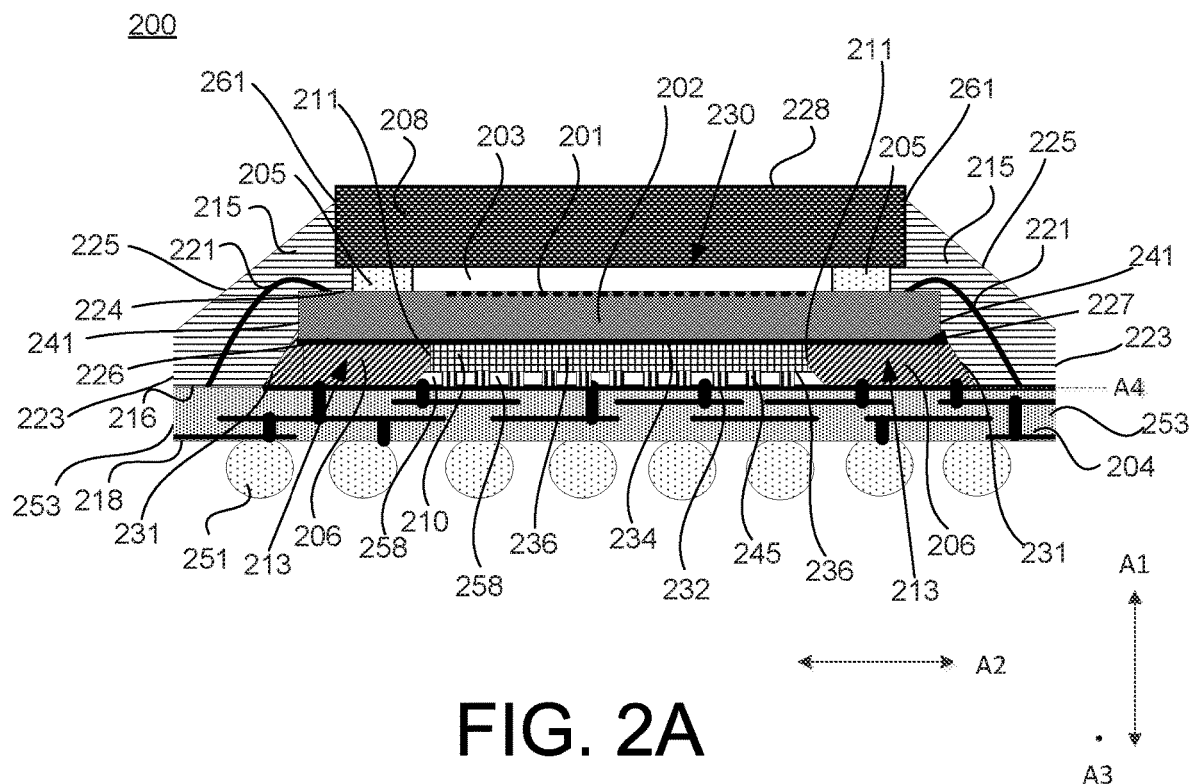
FIGS. 2A and 2B illustrate stack packaging structures for image sensor devices according to various aspects.
Figure 2B:
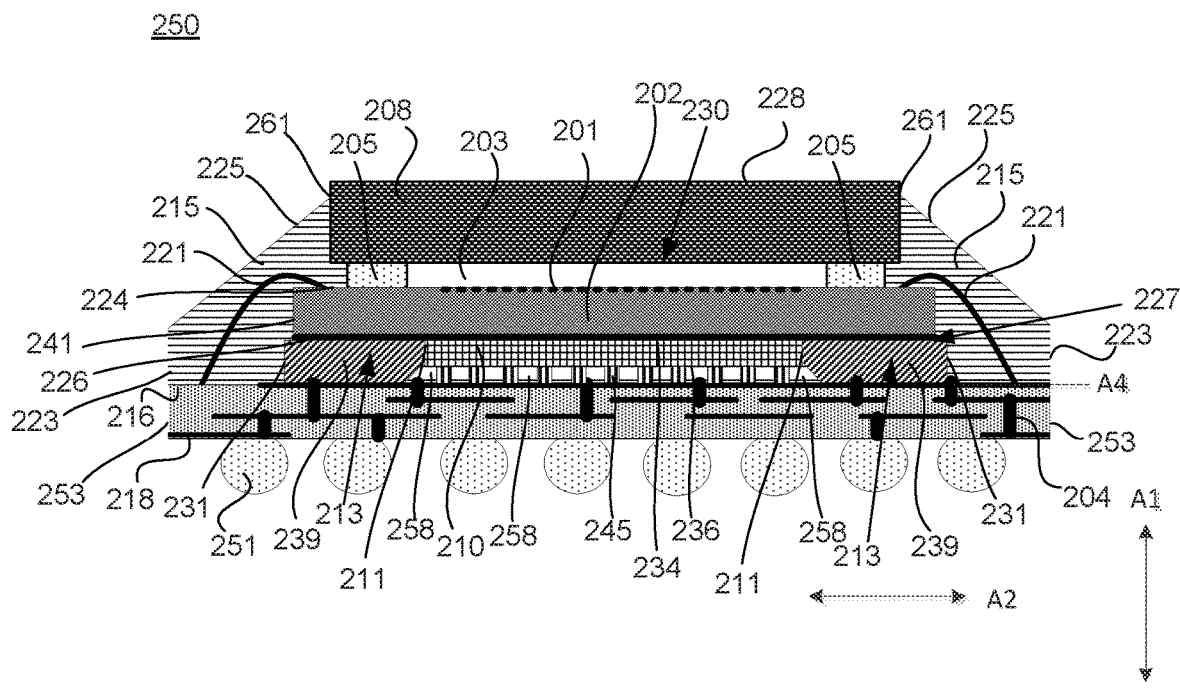

FIG. 2A illustrates a stack packaging structure 200 for an image sensor device 202 according to an aspect. FIG. 2B illustrates a stack packaging structure 250 for the image sensor device 202 according to another aspect. The stack packaging structure 200 of FIG. 2A uses an under-fill material 206 for an inner molding 213. The stack packaging structure 200 of FIG. 2B using an epoxy material 239 for the inner molding 213.

The stack packaging structure 200 may include any one or more of the features discussed with reference to FIGS. 1A through 1C. Referring to FIGS. 2A and 2B, the image sensor device 202 includes an image sensor die having an array of pixel elements configured to convert light into electrical signals. In some examples, the image sensor device 202 includes a complementary metal-oxide semiconductor (CMOS) image sensor. The image sensor device 202 has a first surface 224 and a second surface 226. The first surface 224 defines an active region 201 of the image sensor device 202. The active region 201 includes a pixel area (e.g., the pixel array) configured to receive light.

The stack packaging structure 200 includes a transparent member 208 coupled to the image sensor device 202 such that the transparent member 208 is positioned over (and spaced apart from) the active region 201 of the image sensor device 202. In some examples, the transparent member 208 includes a cover. In some examples, the transparent member 208 includes a lid. In some examples, the transparent member 208 includes a glass material. The transparent member 208 includes a first surface 228, and a second surface 230. The transparent member 208 is positioned away from the image sensor device 202 in a direction A1 such that a space 203 (e.g., empty space) exists between the second surface 230 of the transparent member 208 and the first surface 224 of the image sensor device 202. In some examples, the stack packaging structure 200 includes dam members 205 that position the transparent member 208 away from the active region 201 of the image sensor device 202. For example, the dam members 205 are coupled to the second surface 230 of the transparent member 208 and to the first surface 224 of the image sensor device 202 (at areas apart from the active region 201), where the active region 201 is disposed between adjacent dam members 205.

The stack packaging structure 200 includes a substrate 204. The substrate 204 includes a printed circuit board (PCB) substrate. In some examples, the substrate 204 includes a dielectric material. In some examples, the substrate 204 includes a single layer of PCB base material. In some examples, the substrate 204 includes multiple layers of PCB base material. The substrate 204 includes a first surface 216 and a second surface 218. In some examples, the substrate 204 includes one or more conductive layer portions 232 (e.g., electrical traces) disposed on the first surface 216 of the substrate 204 (and/or embedded within the substrate 204), and/or one or more conductive layer portions 232 (e.g., electrical traces) disposed on the second surface 218 of the substrate 204 (and/or embedded within the substrate 204). The electrical traces may include any of the characteristics discussed herein. The first surface 216 of the substrate 204 is disposed in a plane A4. A direction A1 is aligned perpendicular to the plane A4, and a direction A2 is perpendicular to the direction A1. A direction A3 into the page (shown as a dot) is aligned parallel to the plane A4 and is orthogonal to directions A1 and A2. The directions A1, A2, and A3, and plane A4, are used throughout several of the various views of the implementations described throughout the figures for simplicity.

The stack packaging structure 200 includes a first device 210 coupled to the first surface 216 of the substrate 204. In some examples, the first device 210 is coupled to the first surface 216 of the substrate 204 in a flip-chip configuration. In some examples, the first device 210 is coupled to the first surface 216 of the substrate 204 using one or more bump members 245. In some examples, the bump members 245 include pillars and/or bumps. In some examples, the bump members 245 include copper pillars with solder, gold plated bumps, solder bumps, and/or gold stud bumps. The first device 210 may include a first surface 234 and a second surface 236. The bump members 245 may extend from the second surface 236 to the first surface 216 of the substrate 204. In some examples, an under-fill material 258 is disposed between the second surface 236 of the first device 210 and the first surface 216 of the substrate 204, where the under-fill material 258 encapsulates the bump members 245 (e.g., underlying the first device 210). In some examples, the under-fill material 258 includes an epoxy resin material.

The image sensor device 202 has a first dimension (e.g., length or width) that is defined by a distance between edges 241 of the image sensor device 202. In some examples, the first device 210 has a second dimension (e.g., length or width) that is defined by a distance between edges 211 of the first device 210. In some examples, the second dimension is less than the first dimension.

The first device 210 may include an integrated circuit die. In some examples, the first device 210 includes an image signal processor (ISP) integrated circuit (IC) die. In some examples, the first device 210 includes a memory IC die. In some examples, the first device 210 includes a driver IC die. The image sensor device 202 may be coupled to the first device 210. In some examples, an adhesive layer 227 (e.g., a die attach film) is disposed between the second surface 226 of the image sensor device 202 and the first surface 234 of the first device 210. In some examples, the image sensor device 202 is communicatively connected to the substrate 204 using bond wires 221. The bond wires 221 may be connected to the first surface 224 of the image sensor device 202 and the first surface 216 of the substrate 204. The bond wires 221 may be a conductive (e.g., metal) wire such as aluminum, copper, or gold, or any combination thereof, for example.

The stack packaging structure 200 may include a plurality of conductive components 251 coupled to the second surface 218 of the substrate 204. In some examples, the conductive components 251 are surface-mount packaging elements. In some examples, the conductive components 251 include solder balls. The conductive components 251 are components used to connect to an external device (e.g., a ball grid array (BGA) device). However, the conductive components 251 may include other types of surface-mount packaging elements.

The inner molding 213 is disposed between the image sensor device 202 and the substrate 204. Referring to FIG. 2A, the inner molding 213 includes an under-fill material 206. In some examples, the under-fill material 206 includes an epoxy resin. In some examples, the under-fill material 206 is the same material as the under-fill material 258. In some examples, the under-fill material 206 is a different type of under-fill material than the under-fill material 258. Referring to FIG. 2B, the inner molding 213 includes an epoxy material 239. The epoxy material 239 may be the same material as the material for an outer molding 215. In some examples, the epoxy material 239 is a different type of epoxy material than the material for the outer molding 215.

The inner molding 213 may be disposed between the second surface 226 of the image sensor device 202 and the adhesive layer 227. In some examples, the inner molding 213 may be disposed between the adhesive layer 227 and the first surface 216 of the substrate 204. The inner molding 213 may encapsulate the first device 210. The inner molding 213 may extend along an edge 211 of the first device 210 in the direction A1 between the adhesive layer 227 and the first surface 216 of the substrate 204. The inner molding 213 may extend to a molding edge 231 along a direction A2. The molding edge 231 may define a location of where the inner molding 213 ends along the direction A2. In some examples, the molding edge 231 may be disposed at a location between an edge 241 of the image sensor device 202 and an edge 253 of the substrate 204. In some examples, the molding edge 231 may be disposed at a location between the edge 241 of the image sensor device 202 and the edge 211 of the first device 210. In some examples, the molding edge 231 tapers towards the image sensor device 202. In some examples, the molding edge 231 is linear. In some examples, the molding edge 231 includes one or more bent or curved portions.

The outer molding 215 that encapsulates the bond wires 221 (and the connections to the first surface 216 of the substrate 204 and the image sensor device 202). The outer molding 215 may be disposed on the first surface 216 of the substrate 204. The outer molding 215 may extend along the molding edge 231 of the inner molding 213, the edge 241 of image sensor device 202, the dam members 205, and/or an edge 261 of the transparent member 208. In some examples, the entirely of the outer surface (e.g., the entire molding edge 231) of the inner molding 213 is in contact with the outer molding 215. In some examples, the outer molding 215 is disposed on a portion of the first surface 224 of the image sensor device 202. The outer molding 215 may extend from one or more of the edges (e.g., 231, 241, 261) in the direction A2. In some examples, the outer molding 215 defines a first molding edge 223 that defines an end of the outer molding 215 in the direction A2. In some examples, the first molding edge 223 is linear. In some examples, the first molding edge 223 includes one or more angled or curved portions. In some examples, at least a portion of the first molding edge 223 (or all of the first molding edge 223) is aligned with the direction A1. In some examples, the first molding edge 223 is disposed at an angle with respect to the direction A2. In some examples, at least a portion of the first molding edge 223 (or all of the first molding edge 223) is aligned with the edge 253 of the substrate 204. In some examples, the first molding edge 223 is disposed at a location between the edge 253 of the substrate and the molding edge 231 of the inner molding 213.

The outer molding 215 may define a second molding edge 225. The second molding edge 225 may extend from the first molding edge 223 to the edge 261 of the transparent member 208. In some examples, the second molding edge 225 is disposed at a non-zero angle with respect to the first molding edge 223 such that the outer molding 215 is tapered from the first surface of the transparent member 208. In some examples, the second molding edge 225 is disposed perpendicular to the first molding edge 223. In some examples, the second molding edge 225 is linear. In some examples, the second molding edge 225 includes one or more bent or cured portions.

The outer molding 215 includes one or more types of material (e.g., in a molding compound if including multiple types of materials) such as a metal, a plastic, a resin, an epoxy, a phenolic hardener, a silica material, a pigment, a glass, a ceramic casing, and/or so forth. In some examples, the outer molding 215 includes one or more materials different than a material of the inner molding 213. In some examples, the outer molding 215 includes one or more materials that is/are the same as the material of the inner molding 213. In some examples, the outer molding 215 has a different shape than the inner molding 213. In some examples, in the vertical stack direction (e.g., along the direction A1), the outer molding 215 has a thickness greater than a thickness of the inner molding 213. For example, in the direction A1, the inner molding 213 extends from the first surface 216 of the substrate 204 to the adhesive layer 227 below the image sensor device 202. In the direction A1, the outer molding 215 extends from the first surface 216 of the substrate 204 to the first surface 228 of the transparent member 208, the second surface 230 of the transparent member 208, a location between the first surface 228 and the second surface 230, or a location above the first surface 228 of the transparent member 208.

Figure 3:
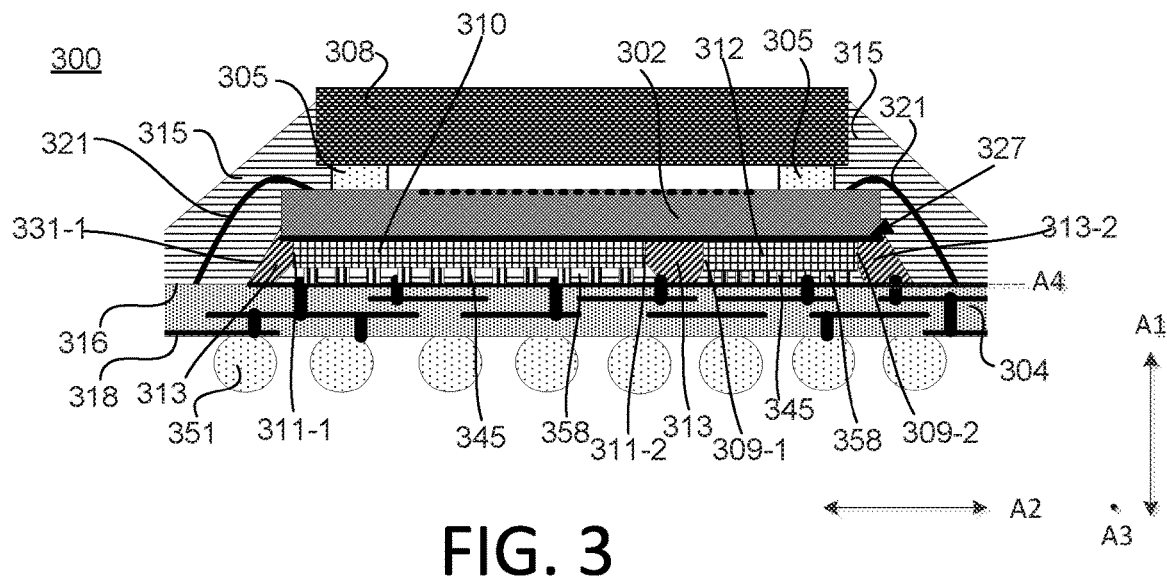
FIG. 3 illustrates a stack packaging structure for an image sensor device according to another aspect.

FIG. 3 illustrates a stack packaging structure 300 for an image sensor device 302 according to another aspect. The stack packaging structure 300 may include any of the features discussed with reference to FIGS. 1A, 1B, 1C, and 2. The stack packaging structure 300 includes the image sensor device 302, a transparent member 308, dam members 305, bond wires 321, an adhesive layer 327, a first device 310, a second device 312, conductive components 351, an inner molding 313, and an outer molding 315. A second surface 318 of the substrate 304 is coupled to the conductive components 351. These components may include any of the features described with reference to the previous figures.

The first device 310 is coupled to a first surface 316 of the substrate 304, and the second device 312 is coupled to the first surface 316 of the substrate 304. In some examples, the second device 312 is coupled to the first surface 316 of the substrate 304 in a flip-chip configuration. In some examples, the second device 312 is coupled to the first surface 316 of the substrate 304 using one or more bump members 345 (e.g., bumps, pillars, etc.). In some examples, an under-fill material 358 is disposed between the second device 312 and the first surface 316 of the substrate 304, where the under-fill material 358 encapsulates the bump members 345 (e.g., underlying the second device 112).

The adhesive layer 327 is disposed on the first device 310 and the second device 312. The inner molding 313 may encapsulate the first device 310 and the second device 312. For example, the inner molding 313 may be disposed between the adhesive layer 327 and the first surface 316 of the substrate 304. The inner molding 313 may extend from a first edge 311-1 of the first device 310 to a first molding edge 331-1. The inner molding 313 may extend between a second edge 311-2 of the first device 310 to a first edge 309-1 of the second device 312. The inner molding 313 may extend from a second edge 309-2 to a second molding edge 331-1 of the inner molding 313.

Figure 4:
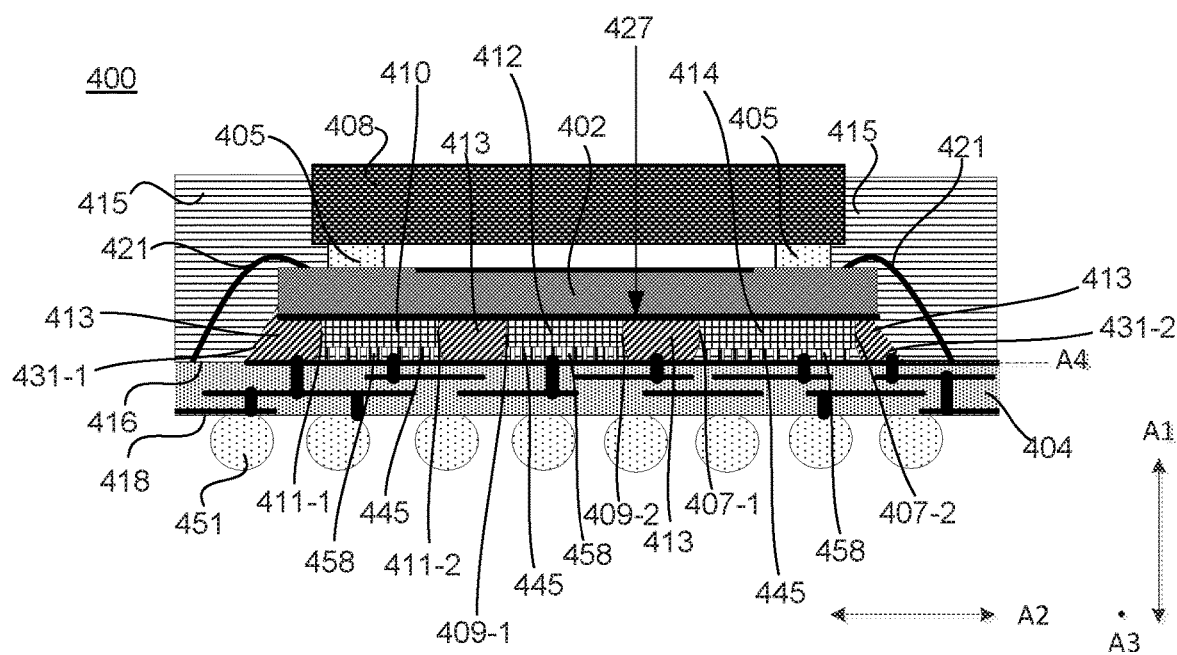
FIG. 4 illustrates a stack packaging structure for an image sensor device according to another aspect.

FIG. 4 illustrates a stack packaging structure 400 for an image sensor device 402 according to another aspect. The stack packaging structure 400 may include any of the features discussed with reference to FIGS. 1A, 1B, 1C, 2, and 3. The stack packaging structure 400 includes the image sensor device 402, a transparent member 408, dam members 405, bond wires 421, an adhesive layer 427, a first device 410, a second device 412, conductive components 451 coupled to a second surface 418 of the substrate 404, an inner molding 413, and an outer molding 415. These components may include any of the features described with reference to the previous figures.

The first device 410 is coupled to the first surface 416 of the substrate 404, the second device 412 is coupled to the first surface 416 of the substrate 404, and the third device 414 is coupled to the first surface 416 of the substrate 404. In some examples, the third device 414 is coupled to the first surface 416 of the substrate 404 in a flip-chip configuration. In some examples, the third device 414 is coupled to the first surface 416 of the substrate 404 using one or more bump members 445 (e.g., bumps, pillars, etc.). In some examples, an under-fill material 458 is disposed between the third device 414 and the first surface 416 of the substrate 404, where the under-fill material 458 encapsulates the bump members 445. The adhesive layer 427 is disposed on a surface of the first device 410, a surface of the second device 412, and a surface of the third device 414.

The inner molding 413 may encapsulate the first device 410, the second device 412, and the third device 414. For example, the inner molding 413 may be disposed between the image sensor device 402 and the adhesive layer 427. The inner molding 413 may extend from a first edge 411-1 of the first device 410 to the first molding edge 431-1. The inner molding 413 may extend between a second edge 411-2 of the first device 410 to a first edge 409-1 of the second device 412. The inner molding 413 may extend from a second edge 409-2 of the second device 412 to the first edge 407-1 of the third device 414. The inner molding 413 may extend from the second edge 407-2 to the second molding edge 431-2.

Figure 5:
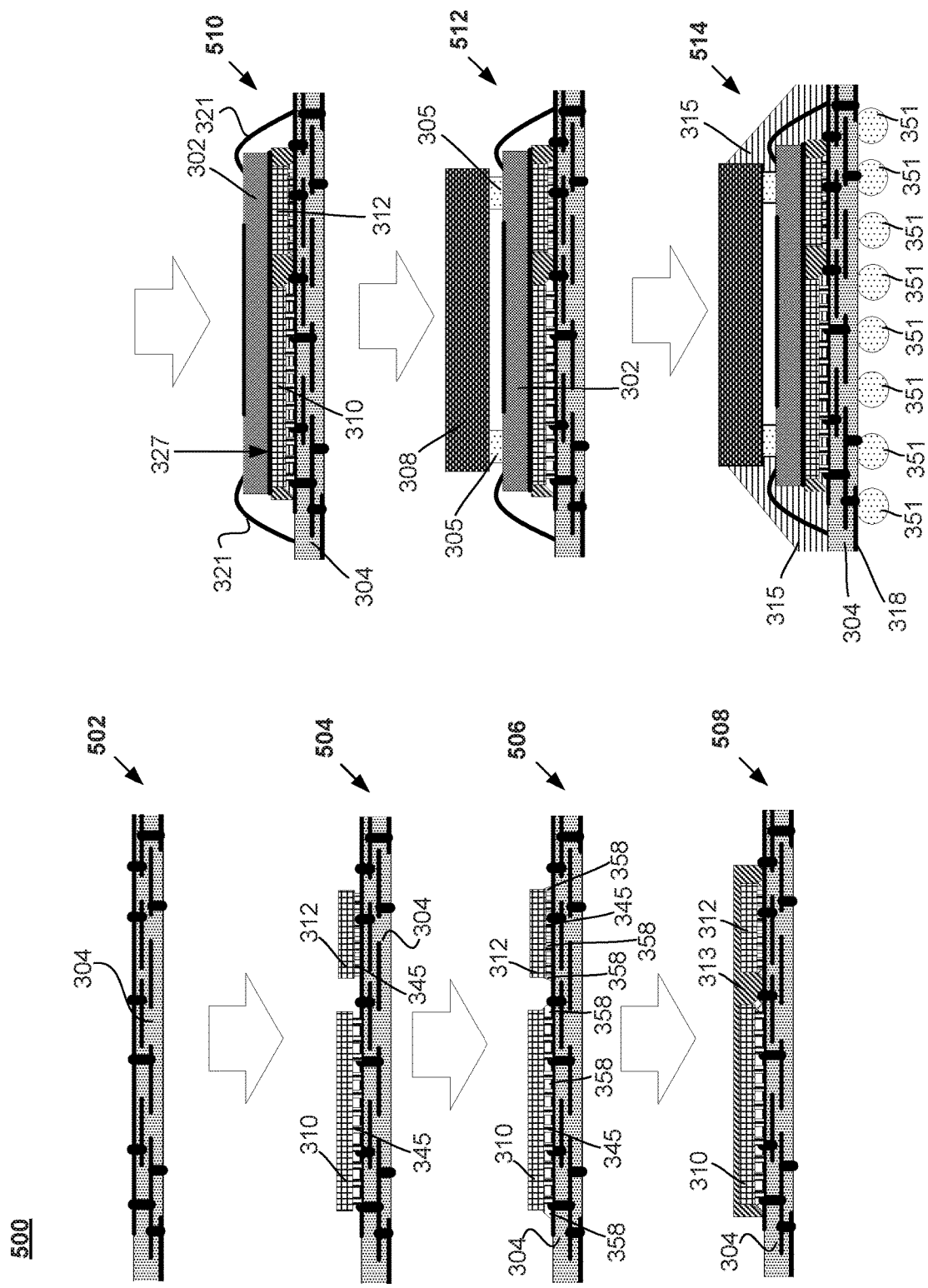
FIGS. 5 through 8 illustrate flowcharts depicting example operations for assembling stack packaging structures according to various aspects.

FIG. 5 depicts a flowchart 500 having example operations for assembling a stack packaging structure according to an aspect. Although the flowchart 500 of FIG. 5 illustrates operations in sequential order, it will be appreciated that this is merely an example, and that additional or alternative operations may be included. Further, operations of FIG. 5 and related operations may be executed in a different order than that shown, or in a parallel or overlapping fashion. In some examples, the flowchart 500 depicts example operations for assembling the stack packaging structure when the inner molding is an epoxy material similar or the same as the epoxy material used for the outer molding. Although the flowchart 500 of FIG. 5 is explained with reference to the stack packaging structure 300 of FIG. 3, the flowchart 500 may be applicable to other stack packaging structures that use an epoxy material similar or the same as the epoxy material used for the outer molding.

In operation 502, the substrate 304 is provided. In operation 504, the first device 310 and the second device 312 are coupled to the first surface 316 of the substrate 304 via the bump members 345. For example, the first device 310 and the second device 312 are coupled to the substrate 304 in a flip-chip configuration. In operation 506, the under-fill material 358 is disposed under the first device 310 and the second device 312 such that the under-fill material 358 encapsulates the bump members 345. In operation 508, the inner molding 313 is disposed on the substrate 304, and surrounds the first device 310 and the second device 312. In operation 510, the adhesive layer 327 is disposed on the first device 310 and the second device 312, and the image sensor device 302 is disposed on the adhesive layer 327. Also, the bond wires 321 are connected to the image sensor device 302 and the substrate 304. In operation 512, the transparent member 308 is coupled to the image sensor device 302 using the dam members 305. In operation 514, the outer molding 315 is disposed on the substrate 304, and the conductive components 351 are coupled to the second surface 218 of the substrate 304.

Figure 6:
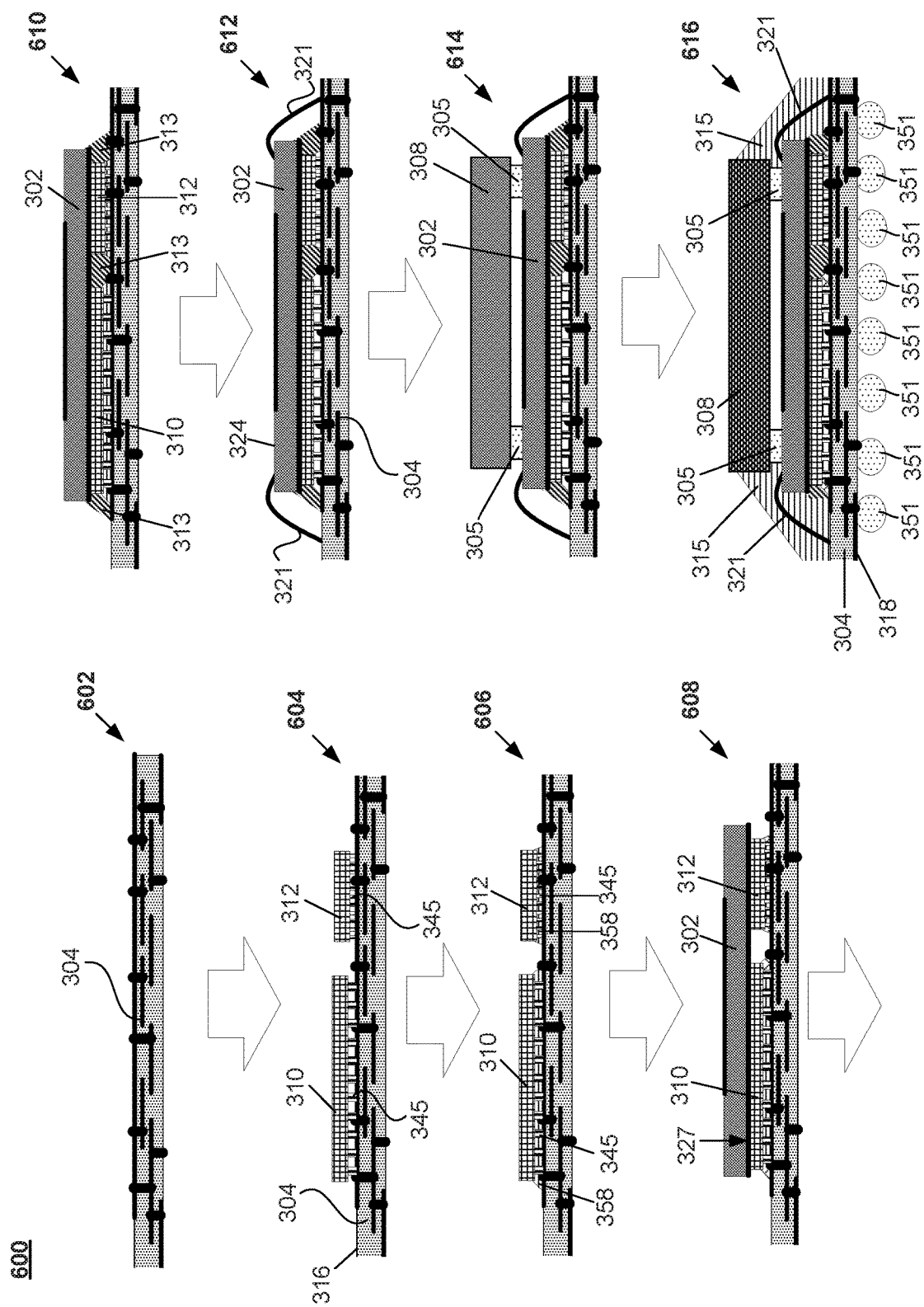

FIG. 6 depicts a flowchart 600 having example operations for assembling a stack packaging structure according to an aspect. Although the flowchart 600 of FIG. 6 illustrates operations in sequential order, it will be appreciated that this is merely an example, and that additional or alternative operations may be included. Further, operations of FIG. 6 and related operations may be executed in a different order than that shown, or in a parallel or overlapping fashion. In some examples, the flowchart 600 depicts example operations for assembling the stack packaging structure when the inner molding is an under-fill material that is similar or the same as the under-fill material used under the devices. Although the flowchart 600 of FIG. 6 is explained with reference to the stack packaging structure 300 of FIG. 3, the flowchart 600 may be applicable to other stack packaging structures that use an under-fill material for the inner molding.

In operation 602, the substrate 304 is provided. In operation 604, the first device 310 and the second device 312 are coupled to the first surface 316 of the substrate 304 in a flip-chip configuration. For example, the first device 310 and the second device 312 are coupled to the first surface 316 of the substrate 304 using the bump members 345. In operation 606, the under-fill material 358 is disposed under the first device 310 and the second device 312 to encapsulate the bump members 345. In operation 608, the adhesive layer 327 is disposed on the first device 310 and the second device 312, and the image sensor device 302 is disposed on the adhesive layer 327. In operation 610, the inner molding 313 is applied between the substrate 304 and the image sensor device 302 to encapsulate the first device 310 and the second device 312. In some examples, the inner molding 313 includes a liquid epoxy resin that is thermally cured. In operation 612, the bond wires 321 are connected to the image sensor device 302 and the substrate 304. In operation 614, the transparent member 308 is coupled to the image sensor device 302 using the dam members 305. In operation 616, the outer molding 315 is applied to the structure to cover the bond wires 321 and at least a portion of an edge of the transparent member 308, and the conductive components 351 are coupled to the second surface 318 of the substrate.

Figure 7:
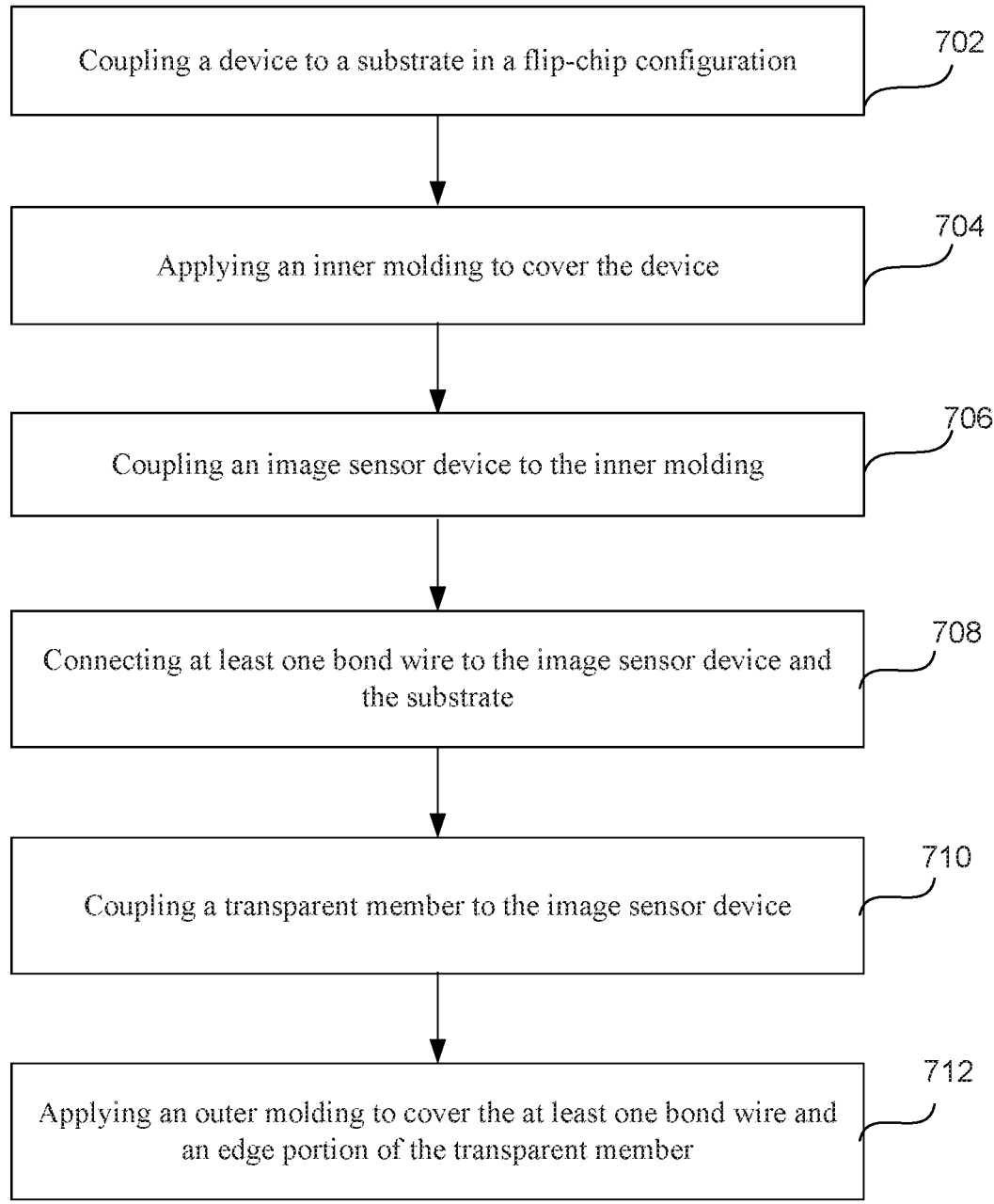

FIG. 7 depicts a flowchart 700 having example operations for assembling a stack packaging structure according to an aspect. Although the flowchart 700 of FIG. 7 illustrates operations in sequential order, it will be appreciated that this is merely an example, and that additional or alternative operations may be included. Further, operations of FIG. 7 and related operations may be executed in a different order than that shown, or in a parallel or overlapping fashion. In some examples, the flowchart 700 depicts example operations for any of the stack packaging structures when the inner molding includes a molding material that is similar or the same as the outer molding.

Operation 702 includes coupling a device to a substrate in a flip-chip configuration. Operation 704 includes applying an inner molding to cover the device. Operation 706 includes coupling an image sensor device to the inner molding. Operation 708 includes connecting at least one bond wire to the image sensor device and the substrate. Operation 710 includes coupling a transparent member to the image sensor device. Operation 712 includes applying an outer molding to cover the at least one bond wire and an edge portion of the transparent member.

Figure 8:
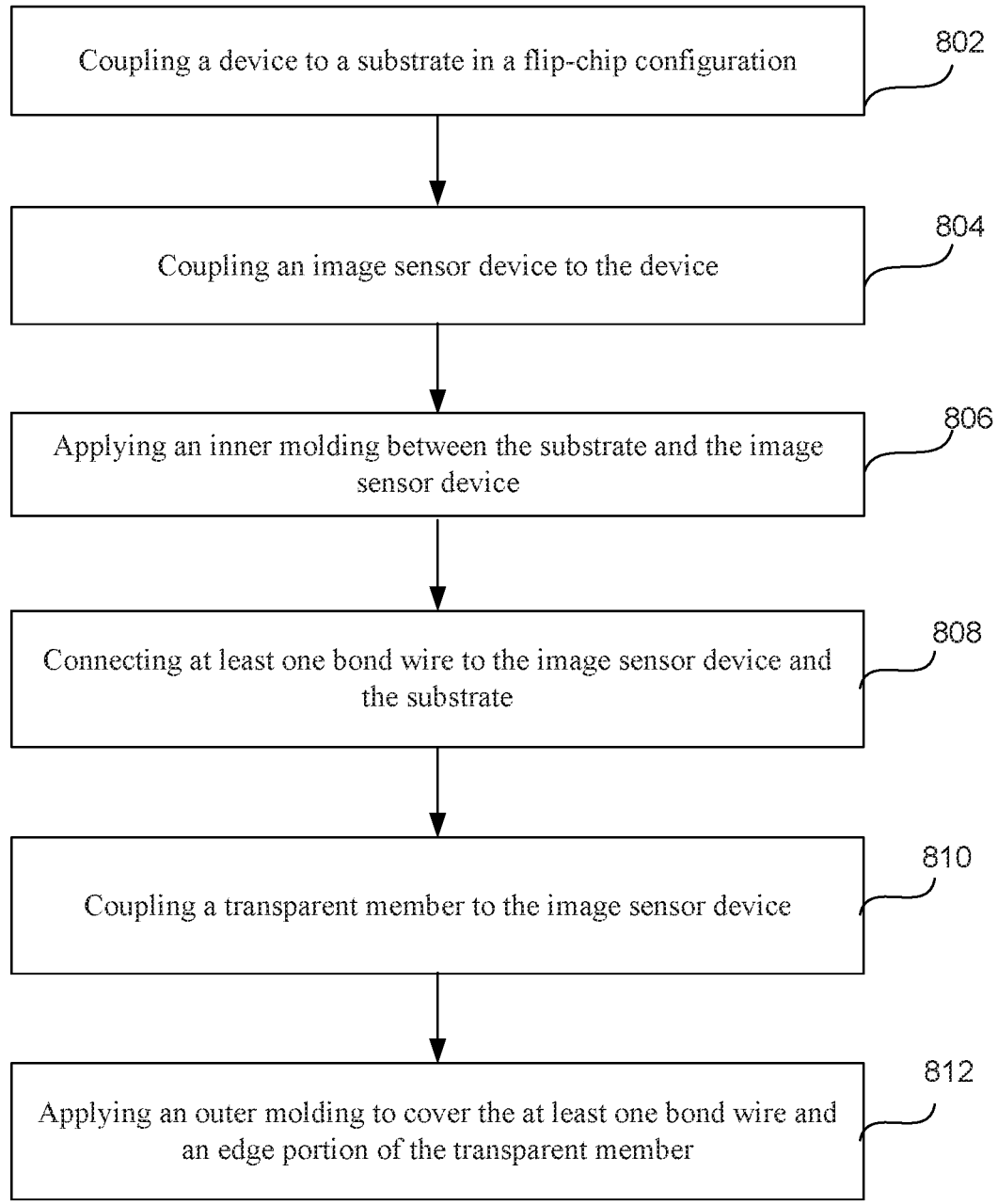

FIG. 8 depicts a flowchart 800 having example operations for assembling a stack packaging structure according to an aspect. Although the flowchart 800 of FIG. 8 illustrates operations in sequential order, it will be appreciated that this is merely an example, and that additional or alternative operations may be included. Further, operations of FIG. 8 and related operations may be executed in a different order than that shown, or in a parallel or overlapping fashion. In some examples, the flowchart 800 depicts example operations for any of the stack packaging structures when the inner molding includes an under-fill material.

Operation 802 includes coupling a device to a substrate in a flip-chip configuration. Operation 804 includes coupling an image sensor device to the device. Operation 806 includes applying an inner molding between the substrate and the image sensor device. Operation 808 includes connecting at least one bond wire to the image sensor device and the substrate. Operation 810 includes coupling a transparent member to the image sensor device. Operation 812 includes applying an outer molding to cover the at least one bond wire and an edge portion of the transparent member.

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or subcombinations of the functions, components and/or features of the different embodiments described.

What is claimed is:

1. A semiconductor package comprising:
   a substrate;
   a first semiconductor device coupled to a surface of the substrate, the first semiconductor device including an image signal processor (ISP) die;
   a second semiconductor device coupled to the surface of the substrate;
   an image sensor device coupled to the first semiconductor device and the second semiconductor device, the first semiconductor device being disposed between the surface of the substrate and the image sensor device;
   a transparent member coupled to the image sensor device;
   at least one bond wire connected to the image sensor device and the surface of the substrate;
   an inner molding disposed between the surface of the substrate and the image sensor device, the first semiconductor device being encapsulated within the inner molding; and
   an outer molding disposed on the surface of the substrate, the at least one bond wire being encapsulated within the outer molding, the outer molding being coupled to the transparent member.

2. The semiconductor package of claim 1, wherein the outer molding includes a material that is different than a material of the inner molding.

3. The semiconductor package of claim 1, wherein the outer molding includes a material that is the same as a material of the inner molding.

4. The semiconductor package of claim 1, wherein the first semiconductor device is coupled to the surface of the substrate using bump members, the bump members being at least partially disposed within an under-fill material, the inner molding having a material that is the same as the under-fill material.

5. The semiconductor package of claim 1, wherein the inner molding includes an epoxy material.

6. The semiconductor package of claim 1, further comprising:
   an adhesive layer disposed between the image sensor device and the first semiconductor device, the adhesive layer being disposed between the image sensor device and the second semiconductor device.

7. The semiconductor package of claim 1, further comprising:
   a third semiconductor device coupled to the surface of the substrate, the third semiconductor device being encapsulated within the inner molding, the third semiconductor device including a memory die.

8. The semiconductor package of claim 1,
   wherein the transparent member is coupled to the image sensor device via a first dam member and a second dam member such that an empty space exists between an active region of the image sensor device and the transparent member, the first and second dam members including an adhesive material,
   wherein the outer molding extends along an edge of the inner molding, an edge of the image sensor device, an edge of the first dam member, and a first portion of an edge of the transparent member, the outer molding not covering a second portion of the edge of the transparent member.

9. The semiconductor package of claim 1, wherein the outer molding includes a first linear molding edge and a second linear molding edge, the second linear molding edge being disposed at a non-zero angle with respect to the first linear molding edge.

10. The semiconductor package of claim 9, wherein the first linear molding edge is aligned with an edge of the substrate, the second linear molding edge being coupled to the transparent member.

11. The semiconductor package of claim 1, wherein the surface of the substrate is a first surface, the substrate including a second surface opposite to the first surface, the substrate including conductive traces on the first and second surfaces of the substrate, the semiconductor package further including:
    a plurality of solder balls coupled to the second surface of the substrate, the plurality of solder balls configured to connect to an external device.

12. A semiconductor package comprising:
    a substrate;
    a first semiconductor device coupled to a surface of the substrate, the first semiconductor device including an image signal processor (ISP) die;
    a second semiconductor device coupled to the surface of the substrate, the second semiconductor device including a driver die;
    a third semiconductor device coupled to the surface of the substrate, the third semiconductor device including a memory die;
    an image sensor device coupled to the first semiconductor device, the second semiconductor device, and the third semiconductor device using an adhesive layer;
    a transparent member coupled to the image sensor device;
    an inner molding disposed between the surface of the substrate and the image sensor device, the first semiconductor device, the second semiconductor device, and the third semiconductor device being encapsulated within the inner molding; and
    an outer molding disposed on the surface of the substrate, the outer molding extending along an edge of the inner molding and an edge of the image sensor device, the outer molding being coupled to the transparent member.

13. The semiconductor package of claim 12, wherein the first semiconductor device is coupled to the surface of the substrate using bump members, the bump members being at least partially disposed within an under-fill material, the inner molding having a material that is the same as the under-fill material.

14. The semiconductor package of claim 12, wherein the inner molding includes an epoxy material.

15. The semiconductor package of claim 12, wherein the outer molding extends along only a portion of an edge of the transparent member such that the outer molding is disposed below a plane aligned with an outer surface of the transparent member.

16. The semiconductor package of claim 12, further comprising:
    at least one bond wire connected to the image sensor device and the surface of the substrate.

17. A method of assembling a semiconductor package, the method comprising:
    coupling a first semiconductor device to a substrate in a flip-chip configuration the first semiconductor device including an image signal processor (ISP) die;
    coupling a second semiconductor device to the surface of the substrate in a flip-chip configuration, the second semiconductor device including a driver die;
    applying an inner molding to cover the first semiconductor device and the second semiconductor device;
    coupling an image sensor device to the inner molding;

connecting at least one bond wire to the image sensor device and the substrate;

coupling a transparent member to the image sensor device;

applying an outer molding to cover the at least one bond wire and at least a portion of an edge of the transparent member, the transparent member having an outer surface exposed outside of the outer molding.

18. A method of assembling a semiconductor package, the method comprising:

coupling a first semiconductor device to a substrate in a flip-chip configuration the first semiconductor device including an image signal processor (ISP) die;

coupling a second semiconductor device to the surface of the substrate in a flip-chip configuration, the second semiconductor device including a driver die;

coupling an image sensor device to the first semiconductor device and the second semiconductor device;

applying an inner molding between the substrate and the image sensor device;

connecting at least one bond wire to the image sensor device and the substrate;

coupling a transparent member to the image sensor device;

applying an outer molding to cover the at least one bond wire and at least a portion of an edge of the transparent member, the transparent member having an outer surface exposed outside of the outer molding.

19. The semiconductor package of claim 1, wherein the transparent member has an outer surface exposed outside of the outer molding.

20. The semiconductor package of claim 12, wherein the transparent member has an outer surface exposed outside of the outer molding.

* * * * *